(12) United States Patent
Moriwaki

(10) Patent No.: US 11,450,674 B2
(45) Date of Patent: Sep. 20, 2022

(54) SEMICONDUCTOR INTEGRATED CIRCUIT DEVICE

(71) Applicant: SOCIONEXT INC., Kanagawa (JP)

(72) Inventor: Shinichi Moriwaki, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 7 days.

(21) Appl. No.: 16/950,644

(22) Filed: Nov. 17, 2020

(65) Prior Publication Data

US 2021/0074713 A1 Mar. 11, 2021

Related U.S. Application Data

(63) Continuation of application No. PCT/JP2019/018405, filed on May 8, 2019.

(30) Foreign Application Priority Data

May 17, 2018 (JP) .............................. JP2018-095402

(51) Int. Cl.
  *H01L 27/112* (2006.01)
  *H01L 23/528* (2006.01)
  *H01L 27/092* (2006.01)
  *H01L 29/78* (2006.01)

(52) U.S. Cl.
  CPC .... *H01L 27/11273* (2013.01); *H01L 23/5286* (2013.01); *H01L 27/0928* (2013.01); *H01L 29/7827* (2013.01)

(58) Field of Classification Search
  CPC . H01L 27/112; H01L 27/092; H01L 27/0928; H01L 27/1273; H01L 23/528; H01L 23/5286; H01L 21/823885; H01L 21/823871; H01L 29/78; H01L 29/78642; H01L 29/7827; G11C 17/12
  USPC ......................................................... 257/329
  See application file for complete search history.

(56) References Cited

U.S. PATENT DOCUMENTS

| | | | |
|---|---|---|---|
| 9,276,108 B2 | 3/2016 | Liaw | |
| 2002/0179999 A1* | 12/2002 | Lee | G11C 17/126 257/530 |
| 2013/0248980 A1* | 9/2013 | Han | H01L 27/088 257/329 |
| 2014/0104945 A1* | 4/2014 | Lee | H01L 23/50 365/185.05 |

(Continued)

FOREIGN PATENT DOCUMENTS

| | | |
|---|---|---|
| JP | H0461161 A | 2/1992 |
| JP | 2000101039 A | 4/2000 |

OTHER PUBLICATIONS

Written Opinion dated Aug. 13, 2019 in PCT/JP2019/018405 with partial English translation.

(Continued)

*Primary Examiner* — Sheng-Bai Zhu
(74) *Attorney, Agent, or Firm* — McDermott Will & Emery LLP

(57) ABSTRACT

In a ROM cell using a vertical nanowire (VNW) FET, the gate of the VNW FET is connected with a word line (WL), the bottom thereof is connected with a bit line (BL), and the top thereof is selectively connected with a ground potential line. The bottom of the VNW FET of the ROM cell is connected to the bit line (BL) irrespective of the data stored in the ROM cell.

6 Claims, 18 Drawing Sheets

(56) References Cited

U.S. PATENT DOCUMENTS

| | | | | |
|---|---|---|---|---|
| 2015/0017767 A1* | 1/2015 | Masuoka | ............... | H01L 27/092 438/211 |
| 2015/0380547 A1* | 12/2015 | Liaw | ................... | H01L 29/7841 257/329 |
| 2016/0133623 A1* | 5/2016 | Xie | ................... | H01L 29/66545 257/384 |
| 2016/0343450 A1* | 11/2016 | Lee | ................... | H01L 27/11573 |
| 2018/0033792 A1* | 2/2018 | Masuoka | ........... | H01L 21/76805 |
| 2018/0053767 A1* | 2/2018 | Cheng | ................. | H01L 23/5252 |
| 2018/0151576 A1* | 5/2018 | Lee | ................... | H01L 21/76897 |
| 2019/0228818 A1* | 7/2019 | Liaw | ......................... | G11C 8/16 |
| 2020/0035691 A1* | 1/2020 | Reznicek | ........... | H01L 21/26513 |
| 2020/0091240 A1* | 3/2020 | Hong | ................. | H01L 27/2463 |

OTHER PUBLICATIONS

International Search Report dated Aug. 13, 2019 in PCT/JP2019/018405 with partial English translation.

\* cited by examiner

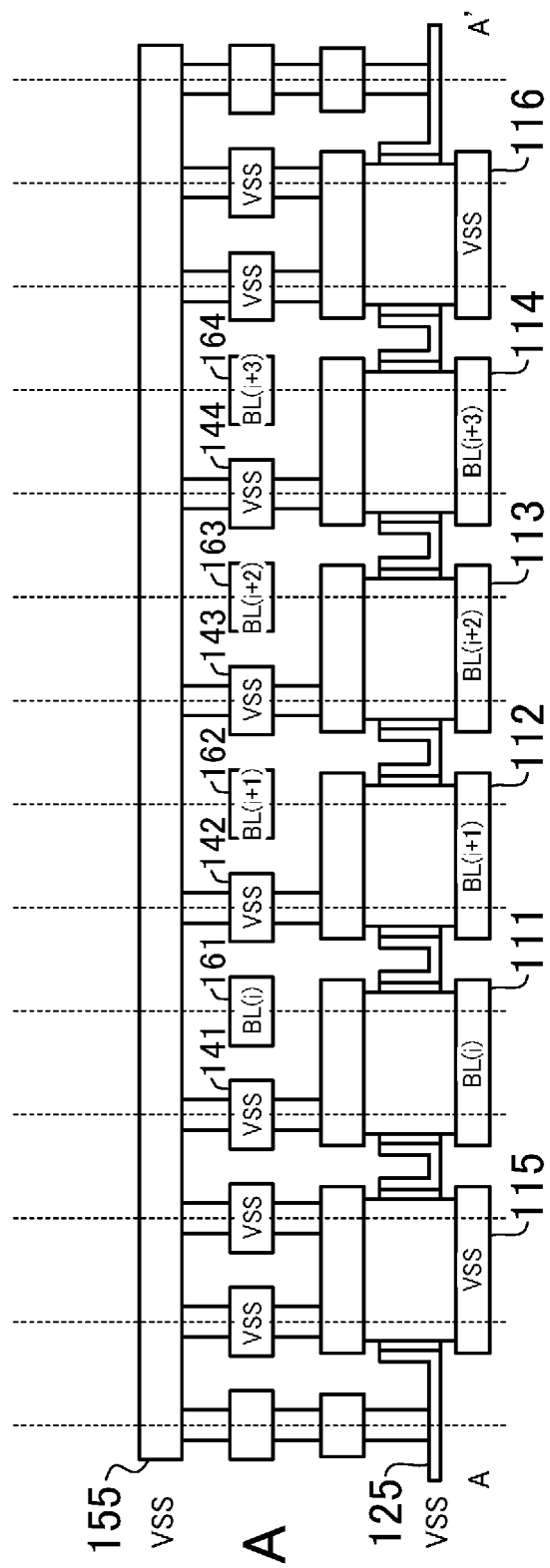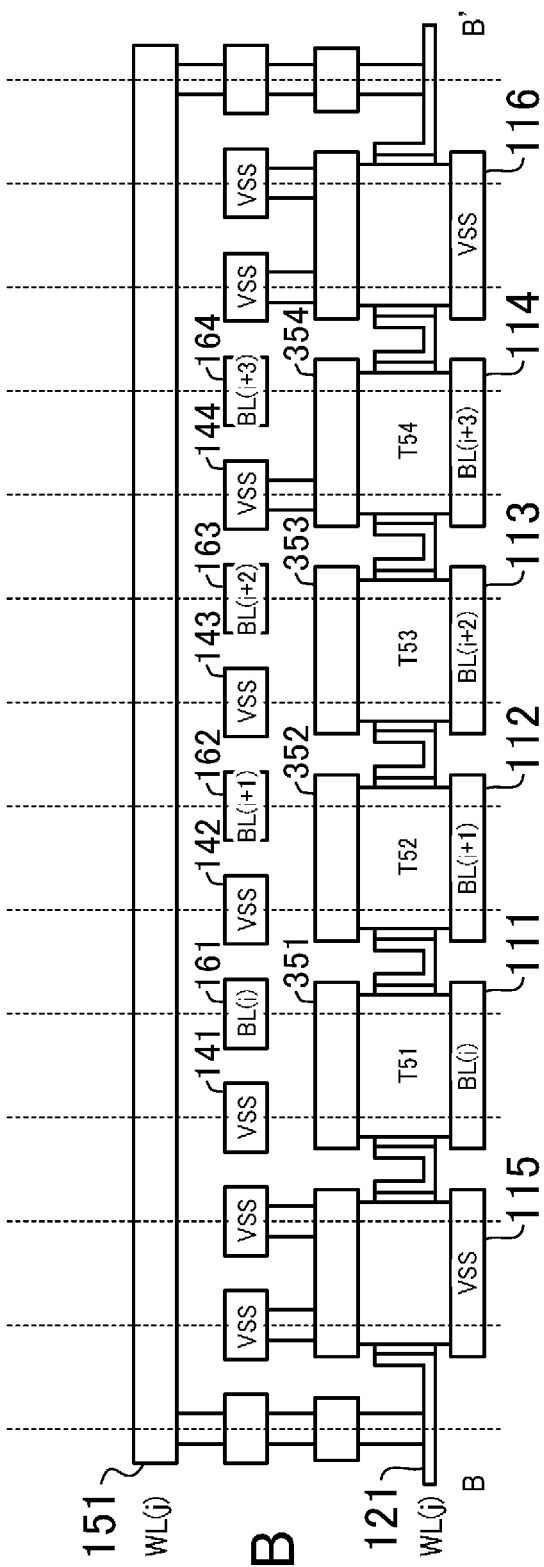

SEMICONDUCTOR INTEGRATED CIRCUIT DEVICE

CROSS-REFERENCE TO RELATED APPLICATIONS

This is a continuation of International Application No. PCT/JP2019/018405 filed on May 8, 2019, which claims priority to Japanese Patent Application No. 2018-095402 filed on May 17, 2018. The entire disclosures of these applications are incorporated by reference herein.

BACKGROUND

The present disclosure relates to a semiconductor integrated circuit device provided with vertical nanowire (VNW) field effect transistors (FETs), and more particularly to a memory cell layout structure of a mask read only memory (ROM).

A mask ROM includes memory cells arranged in an array, and each memory cell is programmed to have a fixed data state during fabrication. A transistor constituting the memory cell is provided between a bit line and VSS with its gate connected to a word line. Bit data "1" or "0" is stored in the memory cell depending on whether or not connection is established between the source or drain of the transistor and the bit line or VSS. Whether or not the connection is established is realized by whether or not there is a contact or a via, for example.

For transistors as basic constituents of an LSI, improvement in integration degree, reduction in operating voltage, and improvement in operating speed have been achieved thanks to scaling down of the gate length. Recently, however, an increase in off current due to excessive scaling and the resulting significant increase in power consumption have raised a problem. To solve this problem, three-dimensional transistors having a three-dimensional structure changed from the conventional planar structure have been vigorously studied. As one type of such transistors, a vertical nanowire FET (hereinafter referred to as a VNW FET as appropriate) has attracted attention.

U.S. Pat. No. 9,276,108 discloses a layout structure of a mask ROM using VNW FETs

SUMMARY

In the layout structure disclosed in the cited patent, bit data "1" or "0" is stored in a VNW FET constituting a ROM cell depending on whether or not connection is established between the top electrode of the transistor and a bit line. In this layout structure, however, the number of VNW FETs connected to each bit line differs among bit lines depending on the programmed state of the mask ROM. For this reason, variations occur in load capacitance among bit lines, causing variations in operations such as a delay.

An objective of the present disclosure is providing a layout structure of ROM cells using VNW FETs that can prevent or reduce variations in operations.

According to a first mode of the present disclosure, a semiconductor integrated circuit device provided with a read only memory (ROM) cell, includes: a word line extending in a first direction; a bit line extending in a second direction perpendicular to the first direction; and a ground potential line that is a metal interconnect extending in the second direction, wherein the ROM cell includes a transistor that is a vertical nanowire (VNW) field effect transistor (FET) provided between the bit line and the ground potential line with its gate connected to the word line, the word line is a gate interconnect, the bit line is a bottom interconnect, the gate electrode of the transistor is connected with the word line, a bottom electrode of the transistor is connected with the bit line, and a top electrode of the transistor is selectively connected with the ground potential line, and the ROM cell stores data depending on whether or not connection is established between the top electrode of the transistor and the ground potential line.

According to the above mode, the ROM cell includes a VNW FET provided between the bit line and the ground potential line with its gate connected to the word line. The gate electrode of this transistor is connected with the word line that is a gate interconnect, the bottom electrode thereof is connected with the bit line that is a bottom interconnect, and the top electrode thereof is selectively connected with the ground potential line. That is, the bottom electrode of the transistor of the ROM cell is connected to the bit line irrespective of the data stored in the ROM cell. This prevents or reduces variations in load capacitance among bit lines and, as a result, can prevent or reduce variations in operations such as a delay.

According to the present disclosure, variations in operations can be prevented or reduced for a semiconductor integrated circuit provided with ROM cells using VNW FETs.

BRIEF DESCRIPTION OF THE DRAWINGS

FIGS. 15A and 15B are cross-sectional views showing the layout structure of FIG. 11.

FIG. 17A is a cross-sectional view and FIG. 17B is a plan view.

DETAILED DESCRIPTION

Embodiments of the present disclosure will be described hereinafter with reference to the accompanying drawings. In the following embodiments, it is assumed that a semiconductor integrated circuit device includes ROM cells and the ROM cells include vertical nanowire FETs (VNW FETs).

Figure 17A:
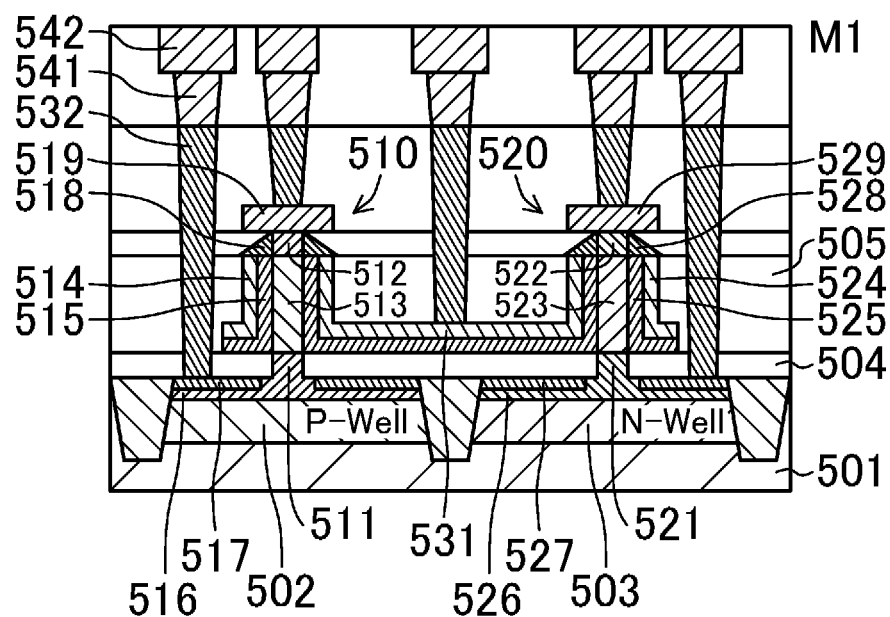
FIGS. 17A and 17B are schematic views showing a basic structure example of vertical nanowire FETs, where
Figure 17B:
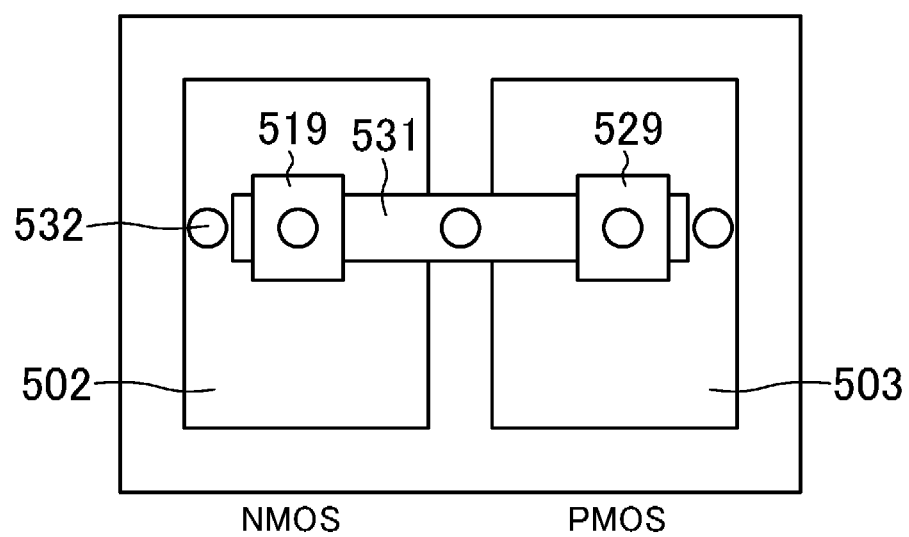

FIGS. 17A and 17B are schematic views showing a basic structure example of VNW FETs, where FIG. 17A is a cross-sectional view and FIG. 17B is a plan view. Note that, in FIG. 17B, illustration of metal interconnects is omitted and, for easy understanding, constituents invisible when actually viewed from top are illustrated.

As shown in FIGS. 17A and 17B, a p-well 502 and an n-well 503 are formed on a semiconductor substrate 501. Note however that no p-well may be formed when the semiconductor substrate 501 is a p-type substrate. A VNW FET 510 that is an n-type transistor is formed on the p-well 502, and a VNW FET 520 that is a p-type transistor is formed on the n-well 503. The reference numeral 504 denotes an insulating film, and 505 denotes an interlayer insulating film.

The VNW FET 510 includes a bottom electrode 511 that is to be a source/drain electrode, a top electrode 512 that is to be a source/drain electrode, and a nanowire 513 formed vertically (perpendicularly to the substrate surface) between the bottom electrode 511 and the top electrode 512. The bottom electrode 511 and the top electrode 512 are doped to have n-type conductivity. At least part of the nanowire 513 is to be a channel region. A gate insulating film 515 is formed around the nanowire 513, and a gate electrode 514 is formed around the gate insulating film 515. The gate electrode 514 may surround the entire of the nanowire 513, or may surround only part of the nanowire 513. When the gate electrode 514 surrounds only part of the nanowire 513, the gate insulating film 515 may be formed on only the portion of the nanowire 513 surrounded by the gate electrode 514.

The bottom electrode 511 is connected with a bottom region 516 formed to spread over the top surface of the semiconductor substrate 501. The bottom region 516 is also doped to have n-type conductivity. A silicide region 517 is formed on the surface of the bottom region 516. A sidewall 518 is formed around the top electrode 512, and a silicide region 519 is formed on the top of the top electrode 512. Note however that formation of the sidewall 518 and the silicide region 519 is not necessarily required.

Likewise, the VNW FET 520 includes a bottom electrode 521 that is to be a source/drain electrode, a top electrode 522 that is to be a source/drain electrode, and a nanowire 523 formed vertically between the bottom electrode 521 and the top electrode 522. The bottom electrode 521 and the top electrode 522 are doped to have p-type conductivity. At least part of the nanowire 523 is to be a channel region. A gate insulating film 525 is formed around the nanowire 523, and a gate electrode 524 is formed around the gate insulating film 525.

The bottom electrode 521 is connected with a bottom region 526 formed to spread over the top surface of the semiconductor substrate 501. The bottom region 526 is also doped to have p-type conductivity. A silicide region 527 is formed on the surface of the bottom region 526. A sidewall 528 is formed around the top electrode 522, and a silicide region 529 is formed on the top of the top electrode 522. Note however that formation of the sidewall 528 and the silicide region 529 is not necessarily required.

In the structure of FIGS. 17A and 17B, the gate electrode region 514 of the VNW FET 510 and the gate electrode region 524 of the VNW FET 520 are mutually connected through a gate interconnect 531. Also, the bottom region 516, the silicide region 519, the gate interconnect 531, the silicide region 529, and the bottom region 526 are individually connected to interconnects 542 formed in a metal interconnect layer M1 via contacts 532 and contacts 541. Another metal interconnect layer may be formed above the metal interconnect layer M1.

The semiconductor substrate 501 is made of any of bulk Si, germanium, and compounds and alloys thereof, for example. Examples of the n-type dopant include As, P, Sb, N, C, and combinations thereof. Examples of the p-type dopant include B, BF2, In, N, C, and combinations thereof. The planar shape of the VNW FETs 510 and 520 (transverse sectional shape of the nanowires 513 and 523) may be a circle, a rectangle, or an ellipse, for example.

Examples of the material of the insulating film 504 include SiN and SiCN. Examples of the material of the interlayer insulating film 505 include SiO, TEOS, PSG, BPSG, FSG, SiOC, SOG, spin-on polymers, SiC, and mixtures thereof. Examples of the material of the silicide regions 517 and 527 include NiSi, CoSi, TiSi, and WSi.

Examples of the material of the gate electrodes 514 and 524 and the gate interconnect 531 include TiN, TaN, TiAl, Ti-containing metal, Ta-containing metal, Al-containing metal, W-containing metal, TiSi, NiSi, PtSi, polysilicon with silicide, and mixtures thereof. Examples of the material of the gate insulating films 515 and 525 include SiON, $Si_3N_4$, $Ta_2O_5$, $Al_2O_3$, Hf oxide, Ta oxide, and Al oxide. The k value is preferably 7 or higher.

As the material of the silicide regions 519 and 529 provided on the top electrodes 512 and 522, NiSi, CoSi, MoSi, WSi, PtSi, TiSi, and mixtures thereof may be used. As another configuration, metals such as W, Cu, and Al, alloys such as TiN and TaN, impurity-implanted semiconductors, and mixtures thereof may be used. As the material of the sidewalls 518 and 528, SiN, SiON, SiC, SiCN, and SiOCN, for example, may be used.

As the material of the contacts 532, Ti, TiN, Ta, and TaN, for example, may be used. Cu, Cu alloy, W, Ag, Au, Ni, and Al may also be used. Alternatively, Co and Ru may be used.

Figure 18A:
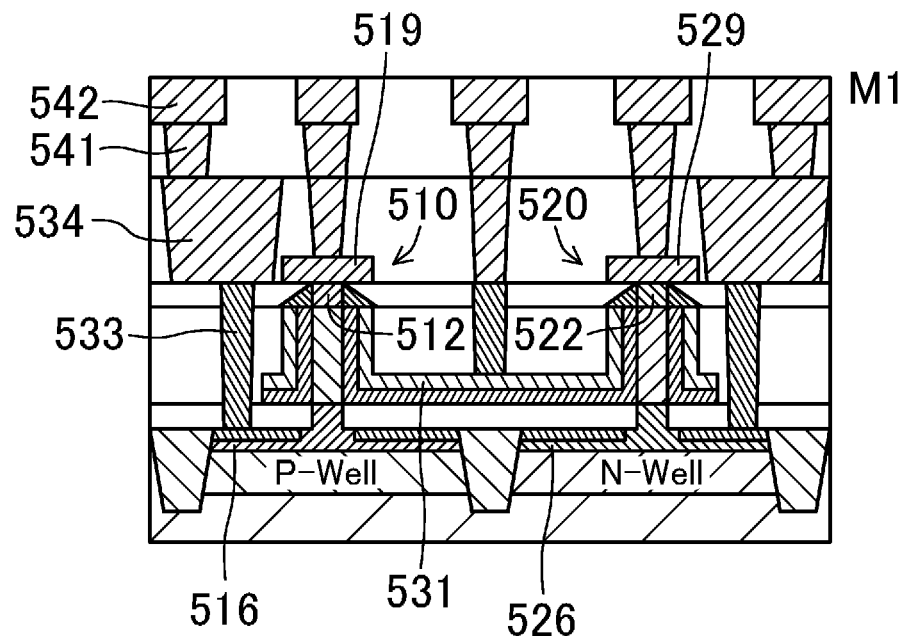
FIGS. 18A and 18B are schematic cross-sectional views showing basic structure examples of vertical nanowire FETs in which local interconnects are used.
Figure 18B:
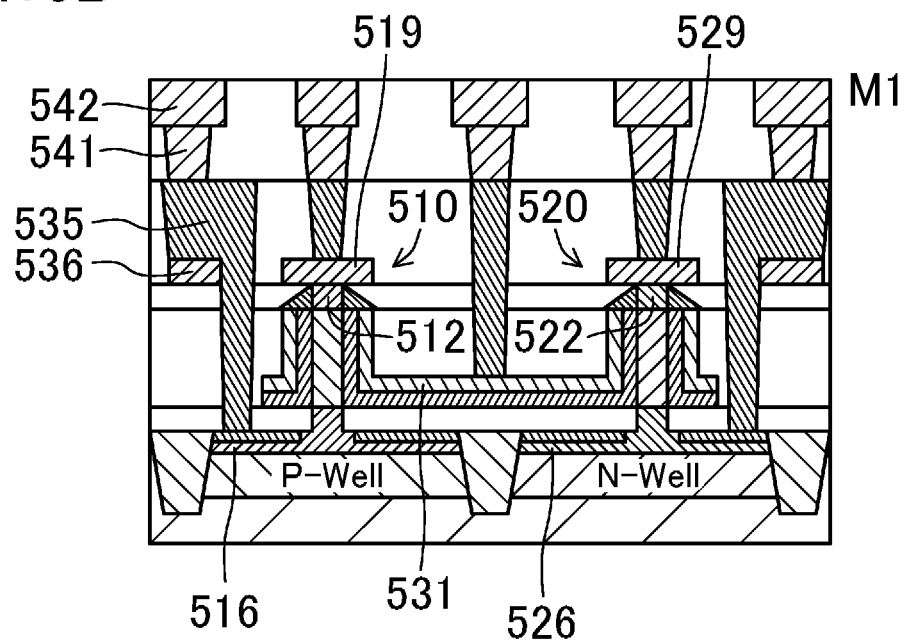

FIGS. 18A and 18B show basic structure examples of VNW FETs in which local interconnects are used. In FIG. 18A, local interconnects 534 are formed between the metal interconnect layer M1 and the top electrodes 512 and 522 of the VNW FETs 510 and 520. The bottom regions 516 and 526 and the gate interconnect 531 are individually connected to the interconnects 542 formed in the metal interconnect layer M1 via contacts 533, local interconnects 534, and the contacts 541. The silicide regions 519 and 529 are individually connected to the interconnects 542 formed in the metal interconnect layer M1 via the local interconnects 534 and the contacts 541.

In FIG. 18B, local interconnects 535 are formed between the metal interconnect layer M1 and the bottom regions 516 and 526. In other words, the local interconnect 535 corresponds to an integrated form of the contact 533 and the local interconnect 534 in FIG. 18A. Silicide regions 536 are used as an etching stopper in the process of forming the local interconnects 535.

In the following description, the bottom electrode, top electrode, and gate electrode of a VNW FET are simply referred to as the bottom, the top, and the gate, respectively, as appropriate. Also, it is assumed that, when one or a plurality of configuration units, each constituted by a vertical nanowire, a top, a bottom, and a gate, constitute one VNW FET, this configuration unit is simply referred to as a "VNW" to distinguish this from the VNW FET. Also, "VDD" refers to a power supply voltage or a high voltage-side power supply line, and "VSS" refers to a power supply voltage or a low voltage-side power supply line.

In the following description, in the plan views such as FIG. 2, the horizontal direction as viewed from the figure is referred to as the X direction (corresponding to the first direction) and the vertical direction as the Y direction (corresponding to the second direction). Also, as used herein, an expression indicating that widths, etc. are the same, like the "same interconnect width" should be understood as including a range of fabrication variations.

First Embodiment

Figure 1:
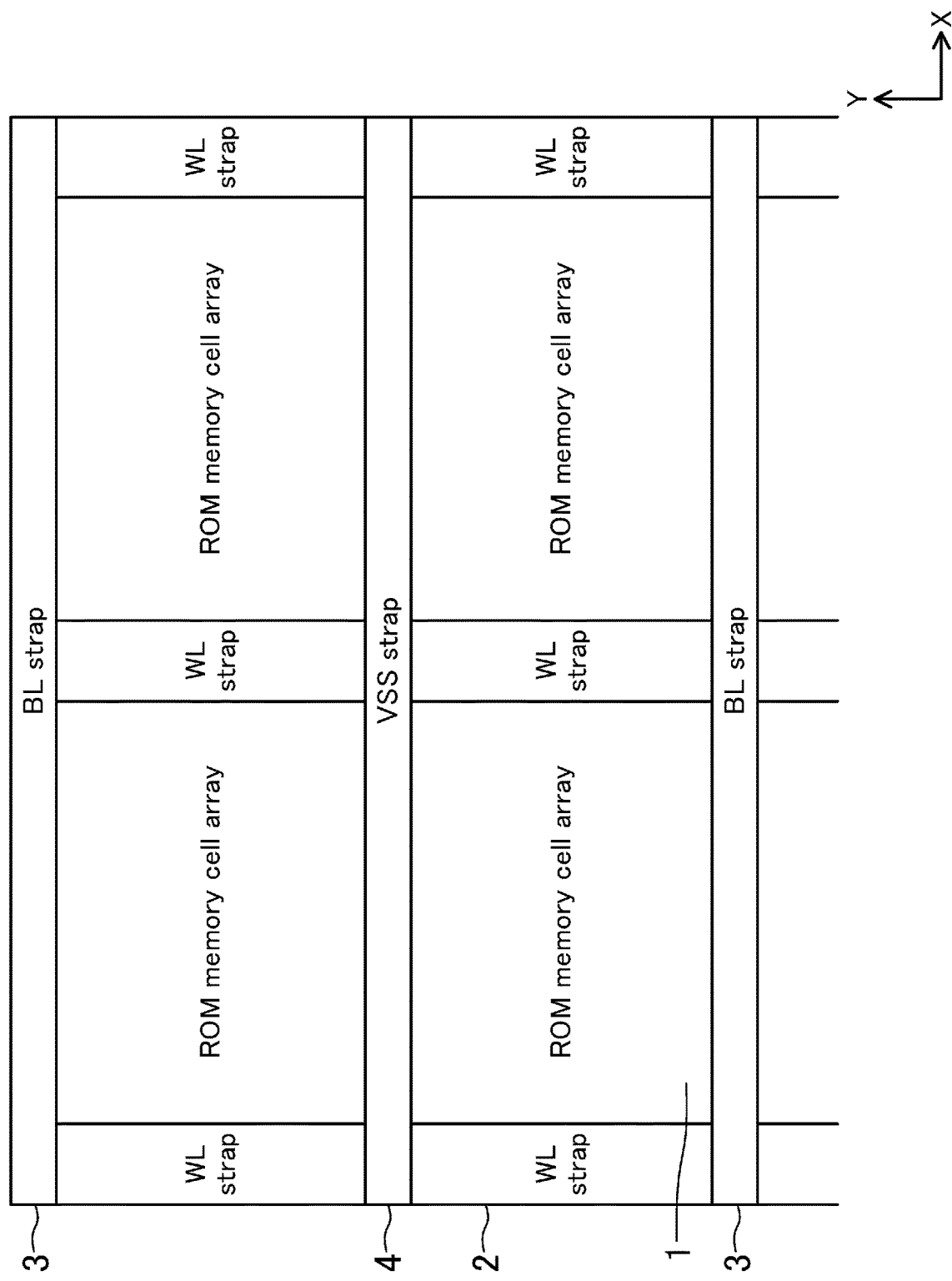
FIG. 1 is a view showing an entire configuration example of a circuit block provided with ROM cells using VNW FETs in a first embodiment.

FIG. 1 is a view showing an entire configuration example of a circuit block in a semiconductor integrated circuit device according to the first embodiment. The circuit block of FIG. 1 includes ROM cells (hereinafter simply called memory cells as appropriate) using VNW FETs. Memory cell arrays 1 each include a plurality of memory cells arranged in an array in the X and Y directions. Word line straps (WL straps) 2 are regions where interconnects in different layers that constitute word lines are connected. Bit line straps (BL straps) 3 are regions where interconnects in different layers that constitute bit lines are connected. A VSS strap (VSS strap) 4 is a region where interconnects in different layers that supply a power supply voltage VSS are connected.

Assume herein that (4×4) memory cells are placed in each of the memory cell arrays 1. The word line straps 2 are placed between the adjacent memory cell arrays 1 in the X direction. The bit line straps 3 and the VSS strap 4 are alternately placed between the adjacent memory cell arrays 1 in the Y direction.

Figure 2:
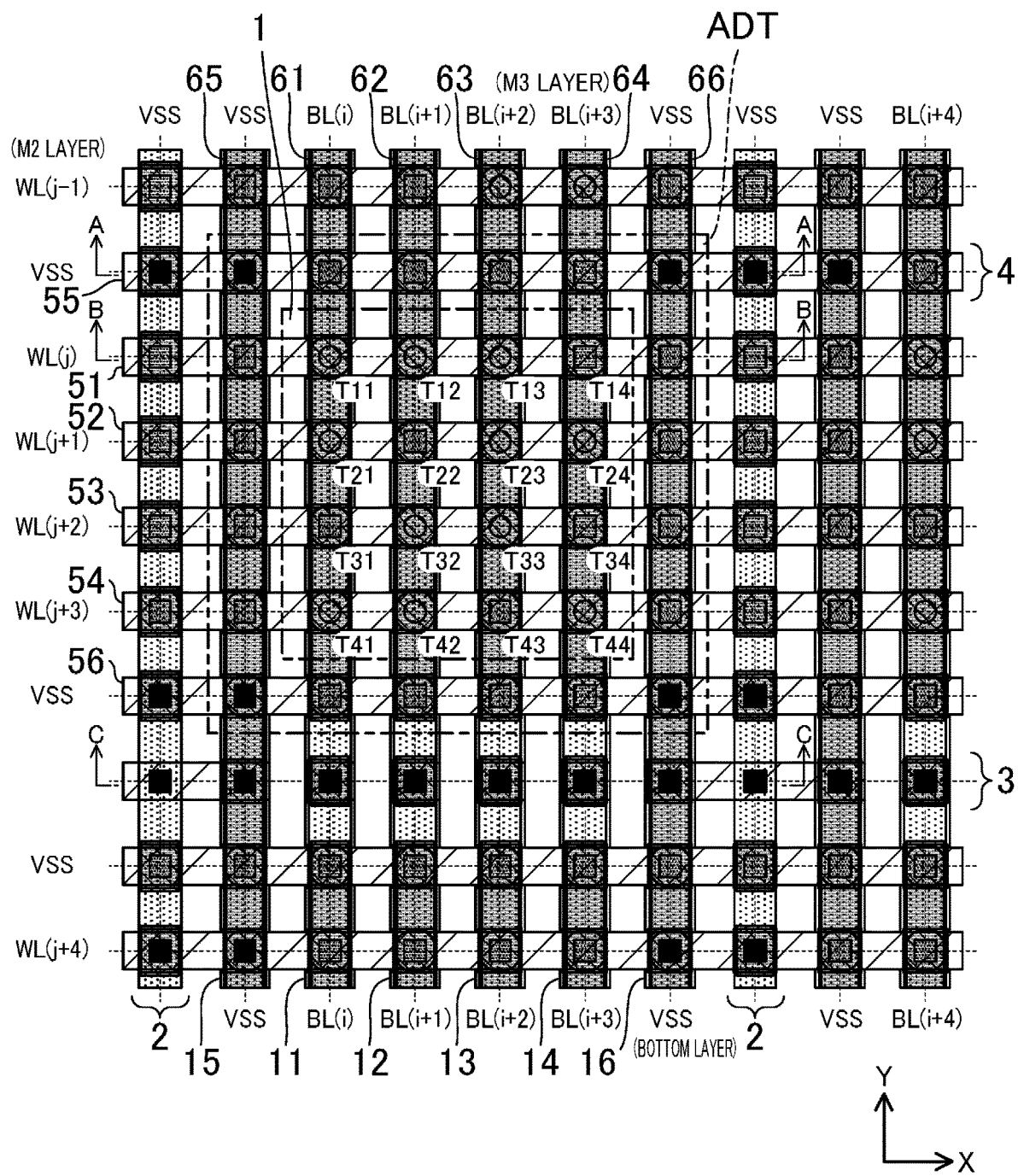
FIG. 2 is a plan view showing a layout structure example of a ROM cell array according to the first embodiment.
Figure 3:
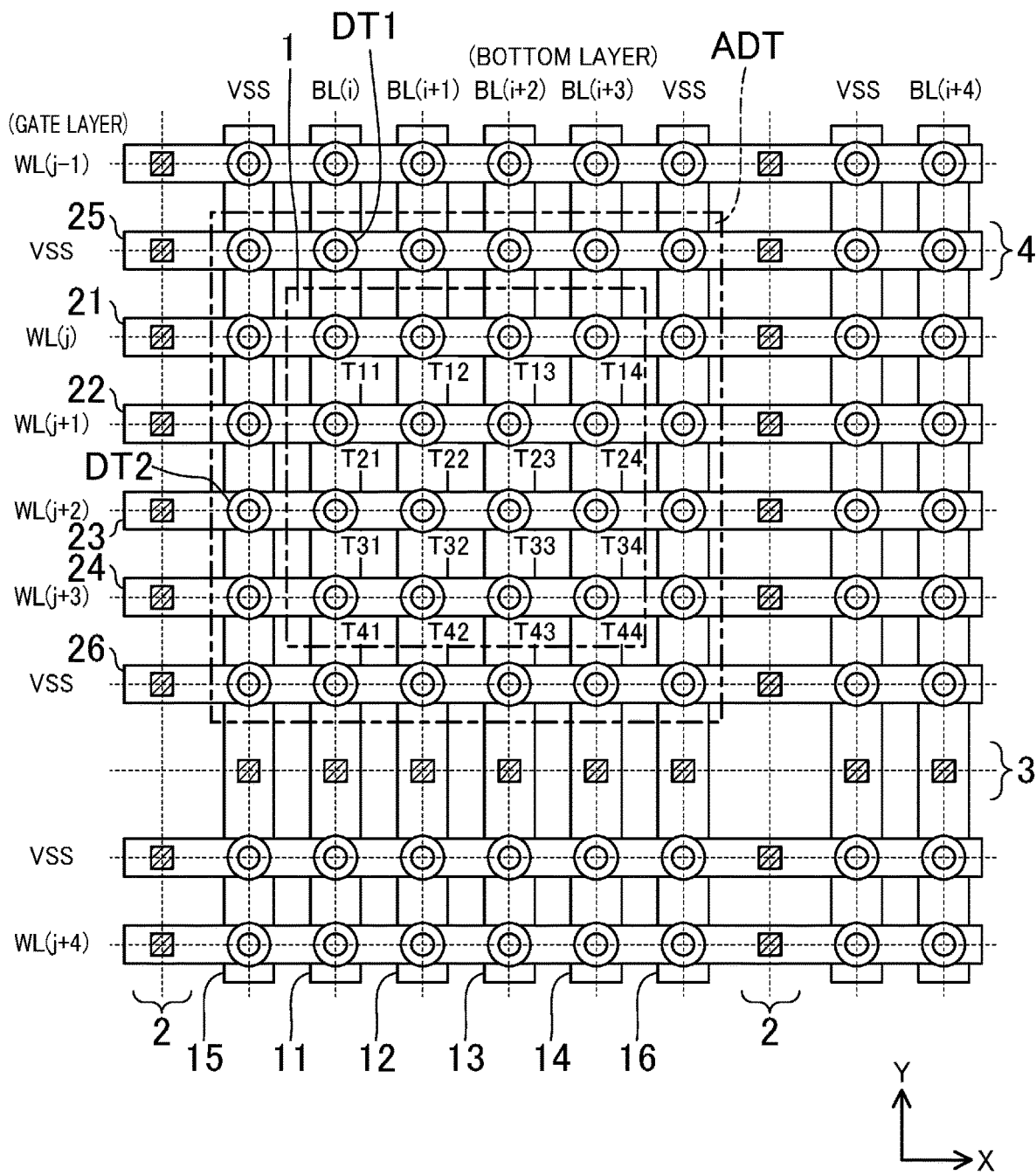
FIG. 3 is a layer-by-layer plan view showing the layout structure of FIG. 2.
Figure 4:
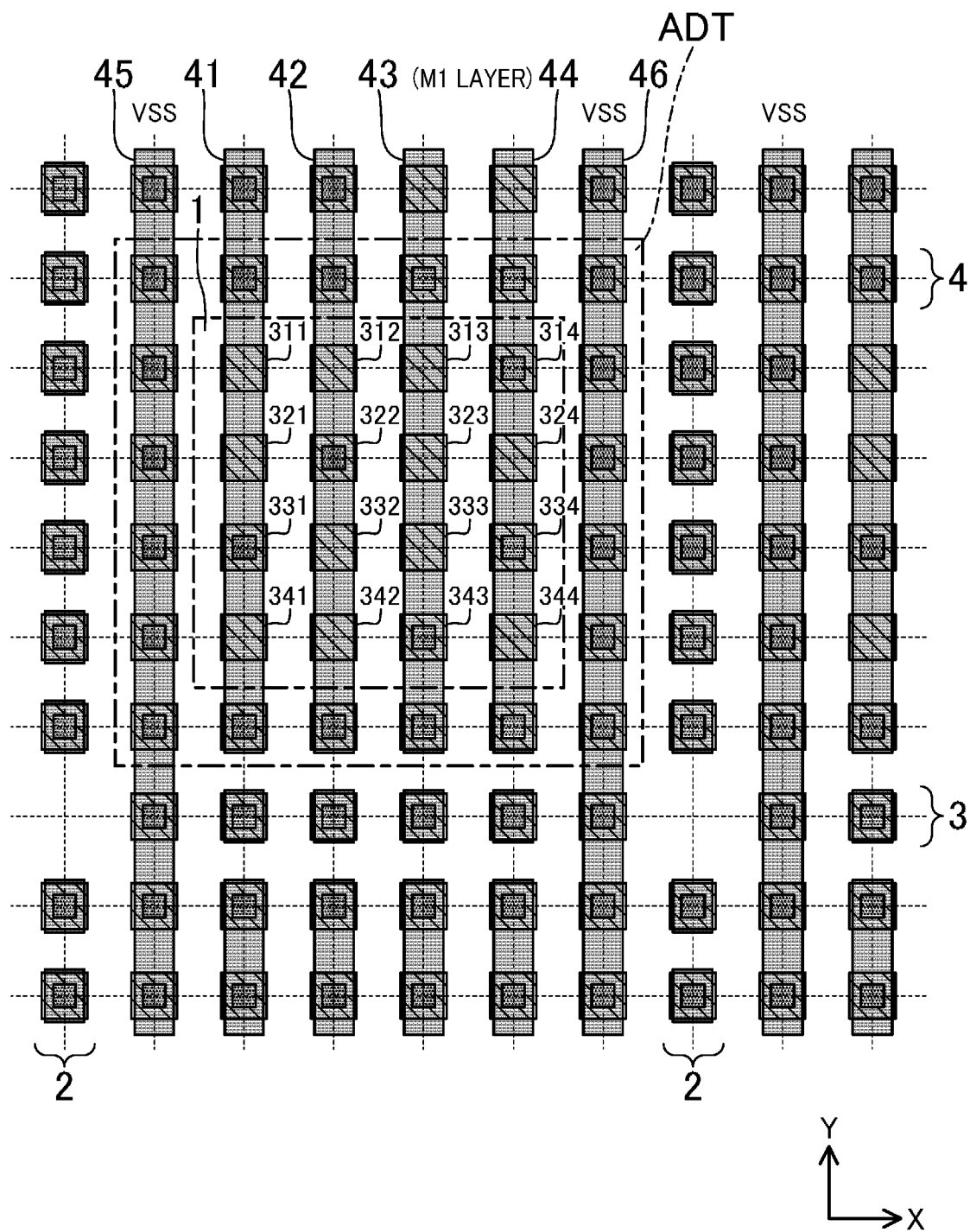
FIG. 4 is a layer-by-layer plan view showing the layout structure of FIG. 2.
Figure 5:
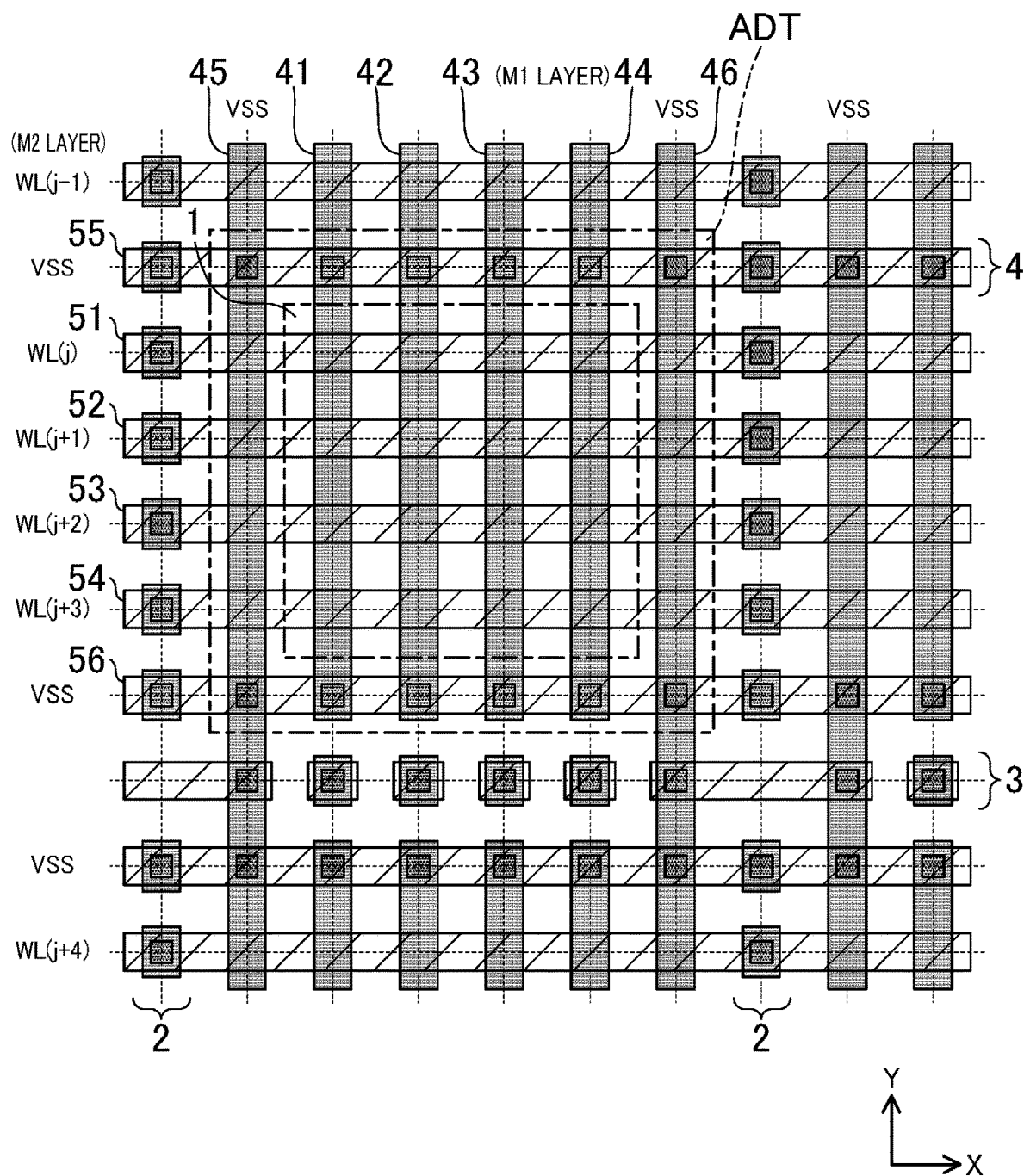
FIG. 5 is a layer-by-layer plan view showing the layout structure of FIG. 2.
Figure 6:
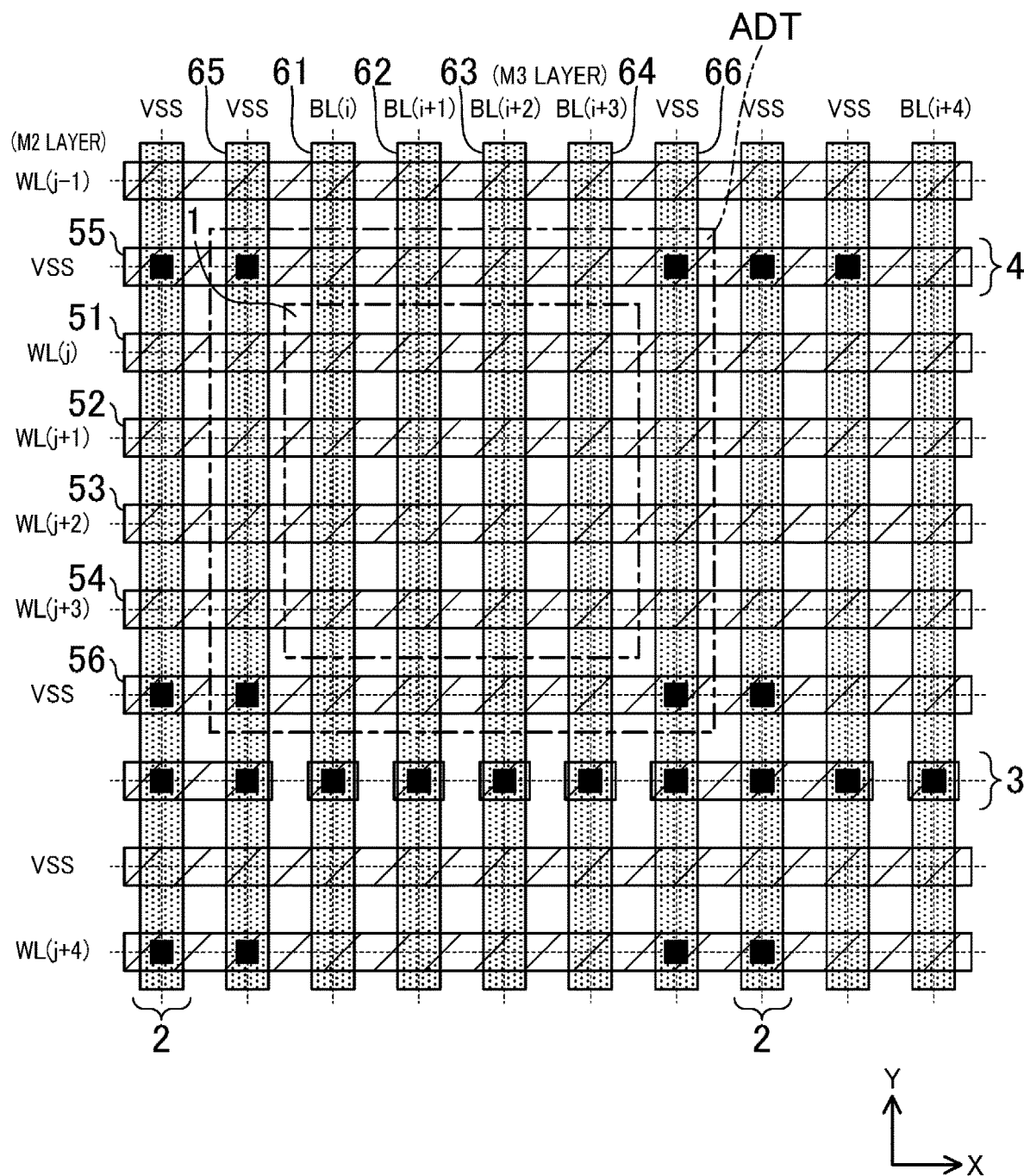
FIG. 6 is a layer-by-layer plan view showing the layout structure of FIG. 2.
Figure 7A:
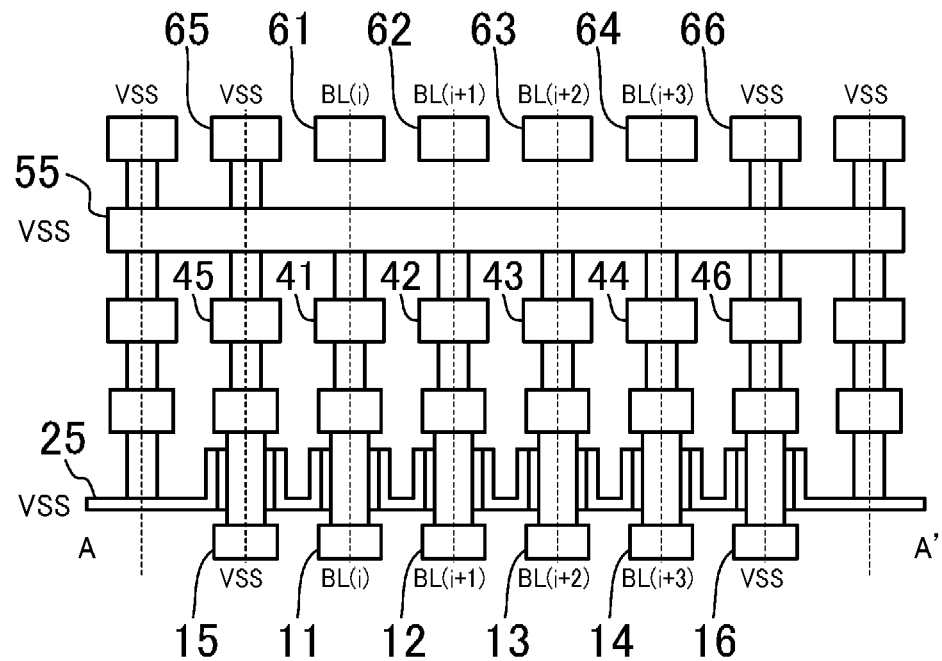
FIGS. 7A and 7B are cross-sectional views showing the layout structure of FIG. 2.
Figure 7B:
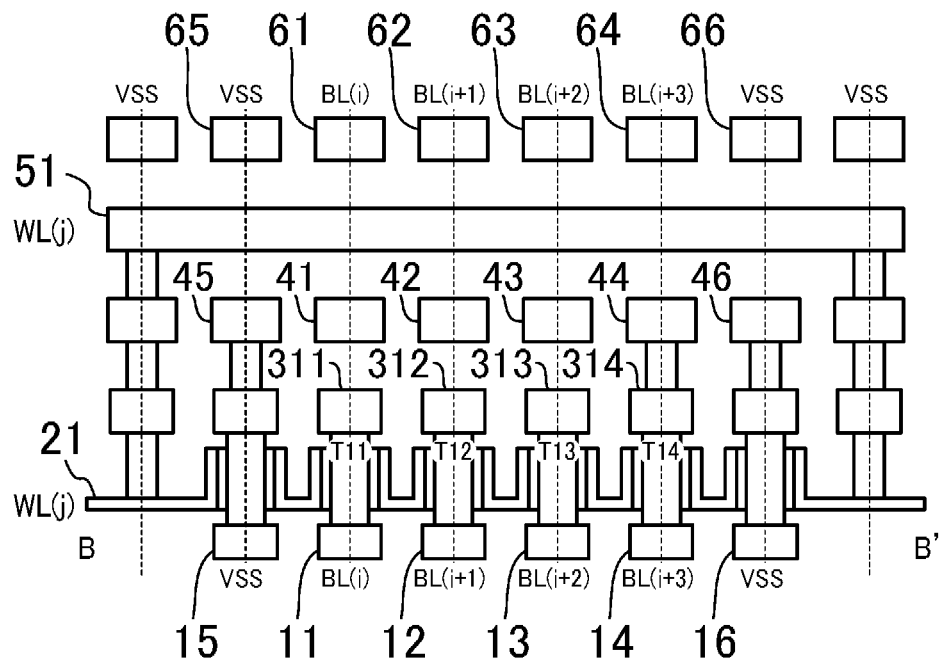
Figure 8:
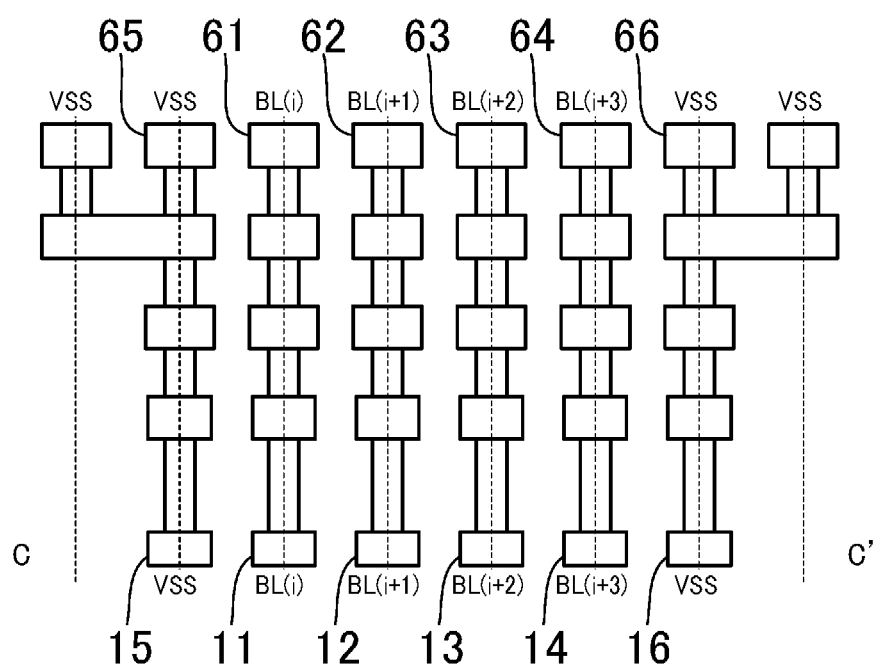
FIG. 8 is a cross-sectional view showing the layout structure of FIG. 2.

FIGS. 2 to 8 are views showing a layout structure example of the memory cell array according to the first embodiment. FIG. 2 is an overall plan view, and FIGS. 3 to 6 are layer-by-layer plan views. Specifically, FIG. 3 shows VNW FETs and layers below them, FIG. 4 shows local interconnects and M1 interconnects, FIG. 5 shows M1 and M2 interconnects, and FIG. 6 shows M2 and M3 interconnects. FIGS. 7A, 7B, and 8 are cross-sectional views taken in the horizontal direction as viewed from top in FIG. 2, where FIG. 7A shows a cross section taken along line A-A', FIG. 7B shows a cross section taken along line B-B', and FIG. 8 shows a cross section taken along line C-C'.

The dashed lines running vertically and horizontally in the plan views such as FIG. 2 and the dashed lines running vertically in the cross-sectional views such as FIG. 7A represent grid lines used for placement of components at the time of designing. The grid lines are placed at equal spacing in the X direction and placed at equal spacing in the Y direction. The grid spacing may be the same, or different from each other, in the X and Y directions. Also, the grid spacing may be different between layers. For example, grid lines for VNW FETs and grid lines for M1 interconnects may be placed at different spacing. Further, the components are not necessarily required to lie on grid lines. It is however preferable to place the components on grid lines from the standpoint of preventing or reducing fabrication variations.

The device structure according to this embodiment is based on the structure of FIG. 18A, although it can be a structure based on the structure of FIG. 17A or FIG. 18B, or based on any other device structure. This also applies to the subsequent embodiments. Also, for easy understanding of the figures, illustration of the wells, the STIs, the insulating films, the silicide layers on the bottoms, the silicide layers on the tops, and the sidewalls of the tops is omitted. This also applies to the subsequent drawings.

Figure 9:
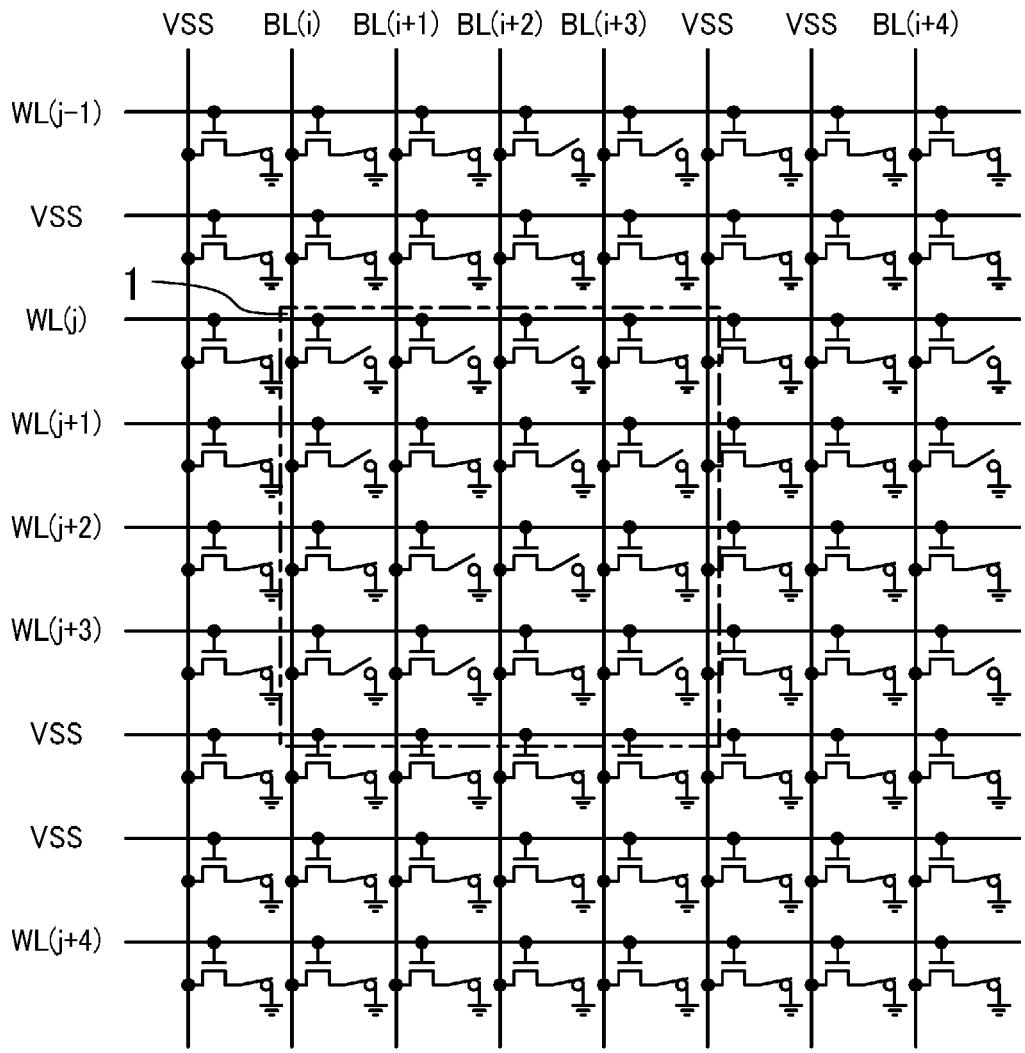
FIG. 9 is a circuit diagram corresponding to the layout structure of FIG. 2.

FIG. 9 is a circuit diagram corresponding to the plan views shown in FIGS. 2 to 6. As shown in FIG. 9, word lines WL extend in the X direction and bit lines BL extend in the Y direction. In the memory cell array 1, each of the memory cells includes a transistor provided between a bit line BL and VSS with its gate connected with a word line WL. The transistor is selectively connected with VSS. Bit data "0" or "1" is stored in each memory cell depending on whether the transistor is in a non-connected state with VSS ("non-connected") or in a connected state with VSS ("connected").

Details of the layout structure of the memory cell array 1 in this embodiment will be described hereinafter.

In the memory cell array 1, transistors T11 to T14, T21 to T24, T31 to T34, and T41 to T44, each constituting a one-bit memory cell, are n-conductivity type VNW FETs each having one VNW. The transistors T11 to T14 are arranged in the X direction, the transistors T21 to T24 are arranged in the X direction, the transistors T31 to T34 are arranged in the X direction, and the transistors T41 to T44 are arranged in the X direction. These transistors T11 to T14, T21 to T24, T31 to T34, and T41 to T44 are arranged in four columns in the Y direction.

A region ADT for formation of dummy memory cells is placed around the transistors T11 to T14, T21 to T24, T31 to T34, and T41 to T44 constituting memory cells. Specifically, dummy memory cells are placed between the memory cell array 1 and the word line straps 2 on both sides of the memory cell array 1 in the X direction. Also, dummy memory cells are placed in the VSS strap 4 on the upper side of the memory cell array 1 as viewed from the figure, and dummy memory cells are placed between the memory cell array 1 and the bit line strap 3 on the lower side of the memory cell array 1 as viewed from the figure. Dummy transistors, e.g., dummy transistors DT1 and DT2, constituting the dummy memory cells are placed in the region ADT.

Bottom interconnects 11, 12, 13, and 14 are formed to extend in the Y direction throughout the memory cell array 1. The bottom interconnects 11, 12, 13, and 14 are bit lines BL. Bottom interconnects 15 and 16 are also placed to extend in the Y direction on both sides of the group of the bottom interconnects 11, 12, 13, and 14 in the X direction. The bottom interconnects 15 and 16 (corresponding to a third ground potential line) supply the power supply voltage VSS.

The transistors T11, T21, T31, and T41 lining up in the Y direction overlap the bottom interconnect 11 as viewed from top, and the bottoms thereof are connected with the bottom interconnect 11. The transistors T12, T22, T32, and T42 lining up in the Y direction overlap the bottom interconnect 12 as viewed from top, and the bottoms thereof are connected with the bottom interconnect 12. The transistors T13, T23, T33, and T43 lining up in the Y direction overlap the bottom interconnect 13 as viewed from top, and the bottoms thereof are connected with the bottom interconnect 13. The transistors T14, T24, T34, and T44 lining up in the Y direction overlap the bottom interconnect 14 as viewed from top, and the bottoms thereof are connected with the bottom interconnect 14.

Dummy transistors overlapping the bottom interconnects 15 and 16 as viewed from top, e.g., the dummy transistor DT2, are connected with the bottom interconnects 15 and 16 at their bottoms.

Gate interconnects 21, 22, 23, and 24 are formed to extend in the X direction throughout the memory cell array 1. The gate interconnects 21, 22, 23, and 24 are word lines WL. Gate interconnects 25 and 26 are also placed to extend in the X direction on both sides of the group of the gate interconnects 21, 22, 23, and 24 in the Y direction. The gate interconnects 25 and 26 (corresponding to a second ground potential line) supply the power supply voltage VSS.

The gates of the transistors T11, T12, T13, and T14 lining up in the X direction are connected with the gate interconnect 21. The gates of the transistors T21, T22, T23, and T24 lining up in the X direction are connected with the gate interconnect 22. The gates of the transistors T31, T32, T33, and T34 lining up in the X direction are connected with the gate interconnect 23. The gates of the transistors T41, T42, T43, and T44 lining up in the X direction are connected with the gate interconnect 24.

Dummy transistors overlapping the gate interconnects 25 and 26 as viewed from top, e.g., the dummy transistor DT1, are connected with the gate interconnects 25 and 26 at their gates.

The tops of the transistors T11 to T14, T21 to T24, T31 to T34, and T41 to T44 are respectively connected to rectangular local interconnects 311 to 314, 321 to 324, 331 to 334, and 341 to 344 formed in a layer above the transistors.

M1 interconnects 41, 42, 43, and 44 extending in the Y direction are formed in a layer above the transistors T11 to T14, T21 to T24, T31 to T34, and T41 to T44. Bit data "0" or "1" of each of the memory cells is set depending on whether or not connection is established between the M1 interconnects 41, 42, 43, and 44 (corresponding to the ground potential line) and the local interconnects 311 to 314, 321 to 324, 331 to 334, and 341 to 344. In FIG. 4, vias are formed between the M1 interconnect 41 and the local interconnect 331, between the M1 interconnect 42 and the local interconnect 322, between the M1 interconnect 43 and the local interconnect 343, and between the M1 interconnect 44 and the local interconnects 314 and 334. That is, the transistors T31, T22, T43, T14, and T34 are in the "connected" state, and the other transistors are in the "non-connected" state.

M1 interconnects 45 and 46 extending in the Y direction are formed on both sides of the group of the M1 interconnects 41, 42, 43, and 44 in the X direction. The M1 interconnects 45 and 46 supply the power supply voltage VSS.

The tops of the dummy transistors are connected with the overlapping M1 interconnects 41 to 46 as viewed from top through local interconnects and vias.

M2 interconnects 51, 52, 53, and 54 extending in the X direction are formed in a layer above the transistors T11 to T14, T21 to T24, T31 to T34, and T41 to T44. The M2 interconnects 51, 52, 53, and 54 (corresponding to the second word line) are respectively connected with the gate interconnects 21, 22, 23, and 24 that are word lines WL through local interconnects, M1 interconnects, and vias in the word line straps 2.

M2 interconnects 55 and 56 are formed on both sides of the group of the M2 interconnects 51, 52, 53, and 54 in the Y direction. The M2 interconnects 55 and 56 supply the power supply voltage VSS. The M2 interconnect 55 is connected with the M1 interconnects 41 to 46 through vias in the VSS strap 4. The M2 interconnect 56 is also connected with the M1 interconnects 41 to 46 through vias.

M3 interconnects 61, 62, 63, and 64 extending in the Y direction are formed in a layer above the transistors T11 to T14, T21 to T24, T31 to T34, and T41 to T44. The M3 interconnects 61, 62, 63, and 64 (corresponding to the second bit line) are respectively connected with the bottom interconnects 11, 12, 13, and 14 that are bit lines BL through local interconnects, M1 interconnects, M2 interconnects, and vias in the bit line strap 3.

M3 interconnects 65 and 66 are formed on both sides of the group of the M3 interconnects 61, 62, 63, and 64 in the X direction. The M3 interconnects 65 and 66 supply the power supply voltage VSS. The M3 interconnects 65 and 66 are both connected with the M2 interconnects 55 and 56 through vias.

In this embodiment, in the memory cell array 1, the memory cells include the transistors T11 to T14, T21 to T24, T31 to T34, and T41 to T44 that are VNW FETs. The gates of the transistors T11 to T14, T21 to T24, T31 to T34, and T41 to T44 are connected with the gate interconnects 21 to 24 (word lines WL), the bottoms thereof are connected with the bottom interconnects 11 to 14 (bit lines BL), and the tops thereof are selectively connected with the M1 interconnects 41 to 44 (ground potential lines). That is, the bottom electrodes of the transistors T11 to T14, T21 to T24, T31 to T34, and T41 to T44 are connected to the bottom interconnects 11 to 14 irrespective of the data stored in the memory cells. This prevents or reduces variations in load capacitance among the bit lines BL and, as a result, can prevent or reduce variations in operations such as a delay.

Dummy memory cells are placed around the memory cell array 1. This prevents or reduces variations in the fabrication of memory cells, and thus leads to improvement in the reliability of the semiconductor integrated circuit device and also improvement in yield.

The bottom interconnects extend in the Y direction, and have the same interconnect width and a fixed interconnect pitch. The gate interconnects extend in the X direction, and have the same interconnect width and a fixed interconnect pitch. The M1 interconnects extend in the Y direction, and have the same interconnect width and a fixed interconnect pitch. The M2 interconnects extend in the X direction, and have the same interconnect width and a fixed interconnect pitch. The M3 interconnects extend in the Y direction, and have the same interconnect width and a fixed interconnect pitch.

Therefore, the fabrication precision of the semiconductor integrated circuit device improves, and variations in device characteristics are prevented or reduced. Note that all the interconnects in each layer do not have to be the same in direction, interconnect width, or interconnect pitch.

The M1 interconnects 41 to 44 corresponding to the ground potential line may be formed integrally. This will decrease the resistance of the ground potential line, thereby making the operation more stable.

Second Embodiment

Figure 10:
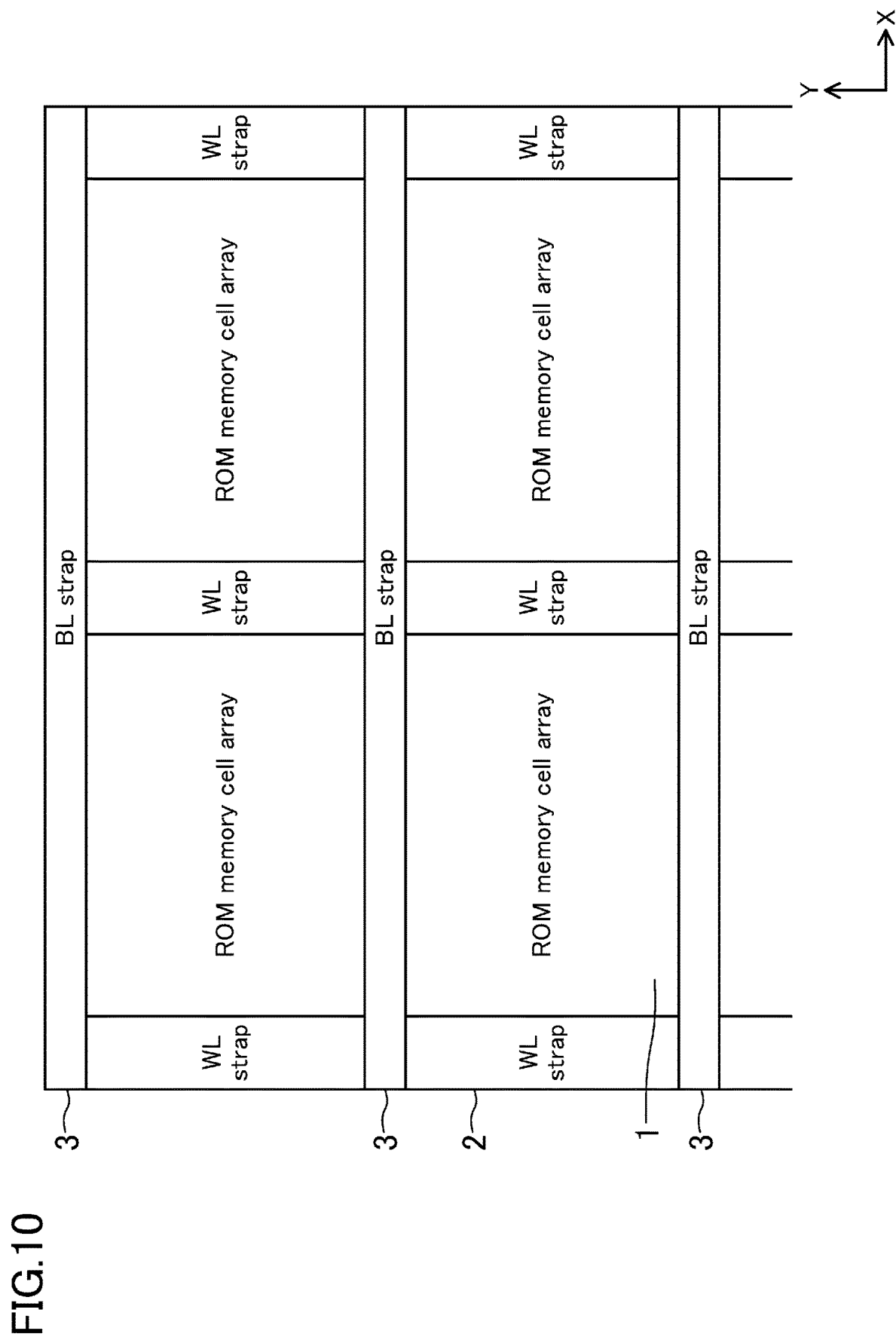
FIG. 10 is a view showing an entire configuration example of a circuit block provided with ROM cells using VNW FETs in a second embodiment.

FIG. 10 is a view showing an entire configuration example of a circuit block in a semiconductor integrated circuit device according to the second embodiment. The circuit block of FIG. 10 is substantially the same as the circuit block of FIG. 1, except that a bit line strap 3 is provided in place of the VSS strap 4. That is, the bit line strap 3 is placed between the adjacent memory cell arrays 1 in the Y direction. Assume that (4×4) memory cells are placed in each of the memory cell arrays 1.

Figure 11:
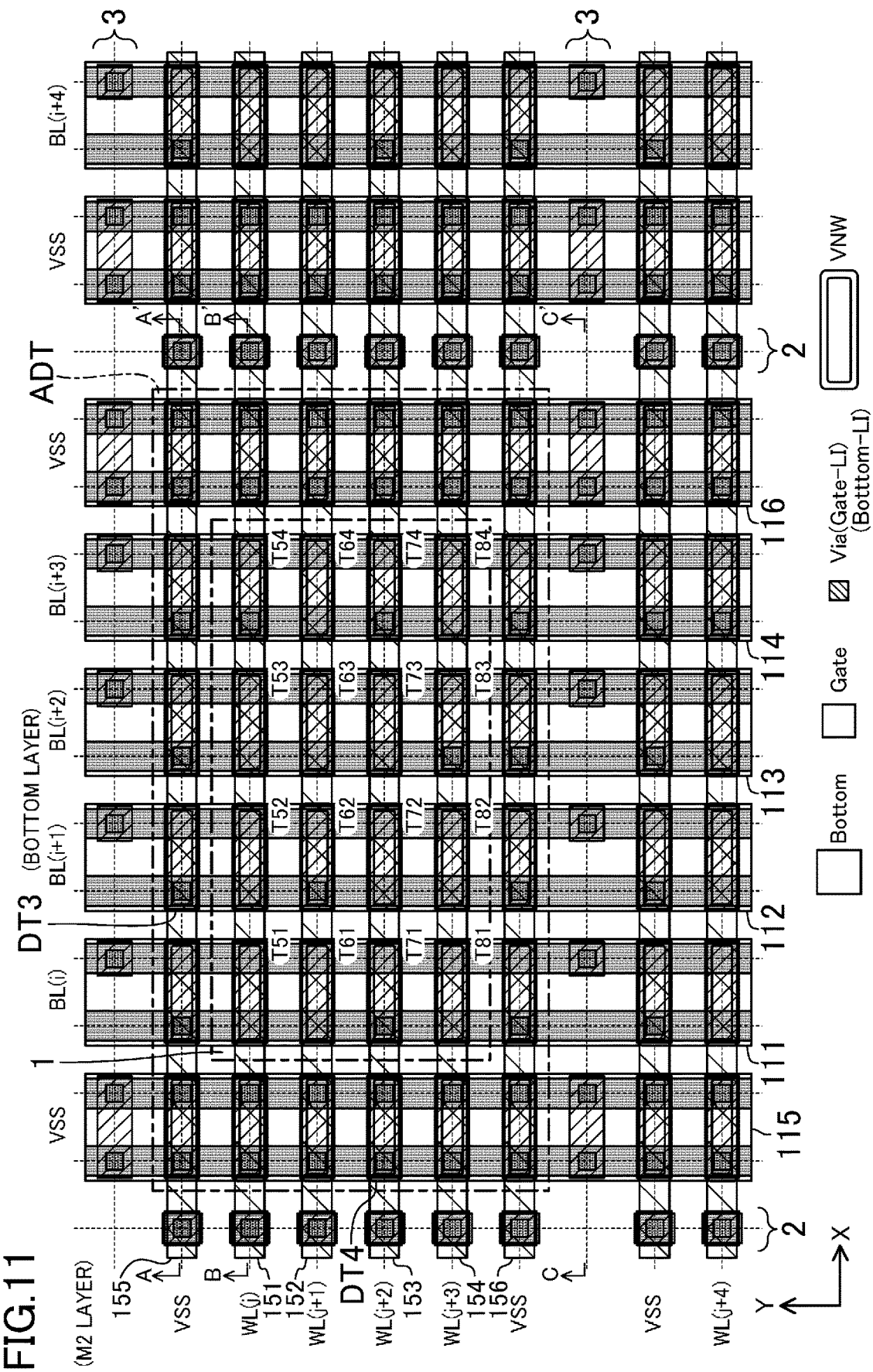
FIG. 11 is a plan view showing a layout structure example of a ROM cell array according to the second embodiment.
Figure 12:
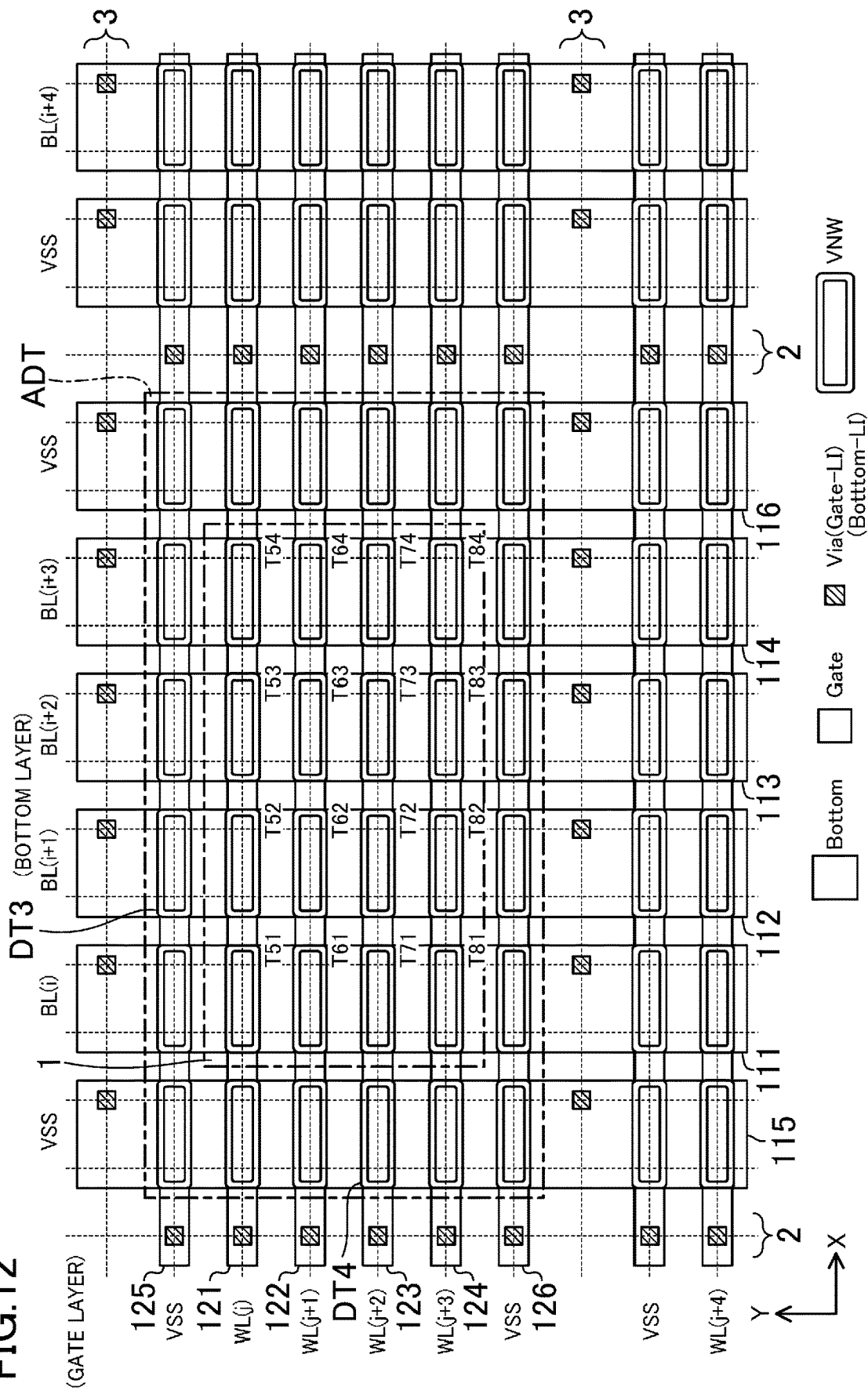
FIG. 12 is a layer-by-layer plan view showing the layout structure of FIG. 11.
Figure 13:
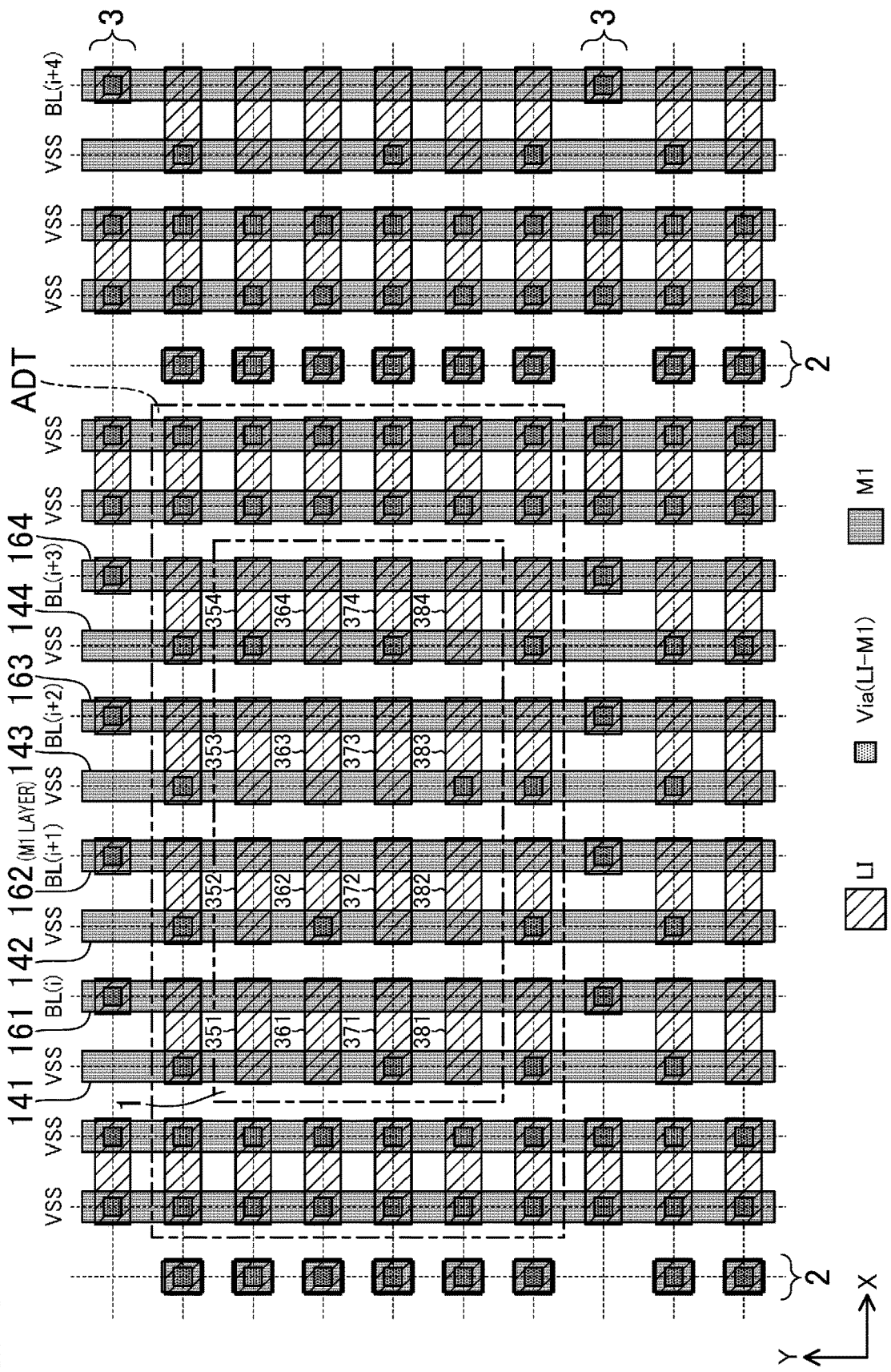
FIG. 13 is a layer-by-layer plan view showing the layout structure of FIG. 11.
Figure 14:
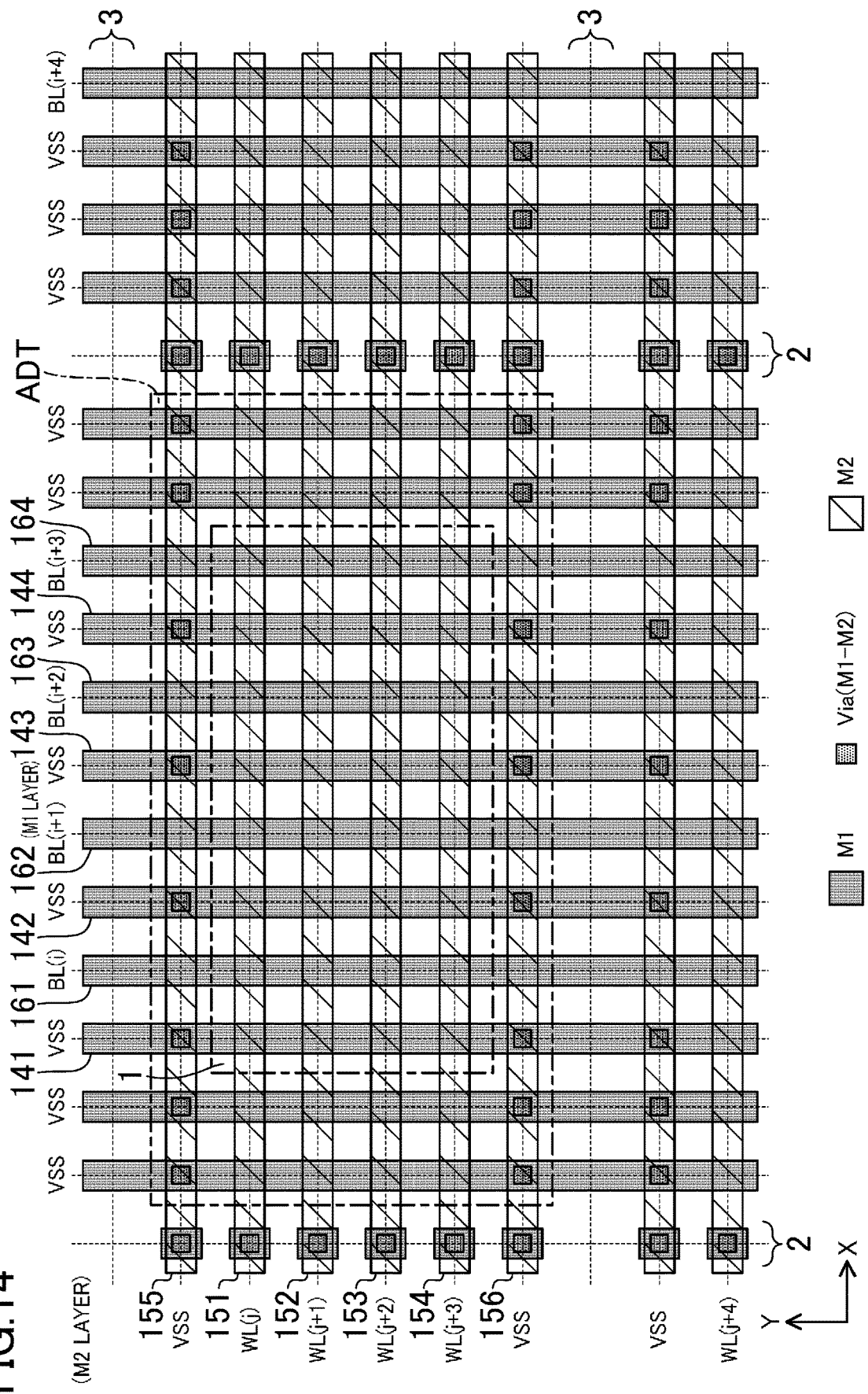
FIG. 14 is a layer-by-layer plan view showing the layout structure of FIG. 11.
Figure 16:
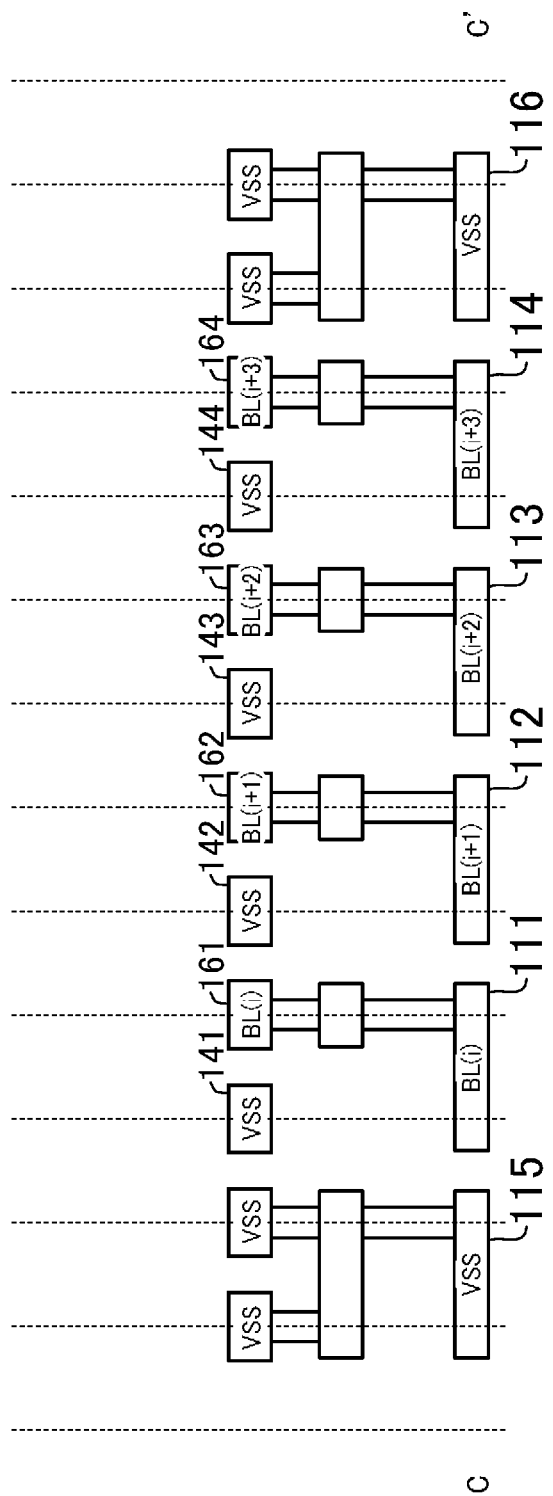
FIG. 16 is a cross-sectional view showing the layout structure of FIG. 11.

FIGS. 11 to 16 are views showing a layout structure example of the memory cell array according to the second embodiment. FIG. 11 is an overall plan view, and FIGS. 12 to 14 are layer-by-layer plan views. Specifically, FIG. 12 shows VNW FETs and layers below them, FIG. 13 shows local interconnects and M1 interconnects, and FIG. 14 shows M1 and M2 interconnects. FIGS. 15A, 15B, and 16 are cross-sectional views taken in the horizontal direction as viewed from top in FIG. 11, where FIG. 15A shows a cross section taken along line A-A', FIG. 15B shows a cross section taken along line B-B', and FIG. 16 shows a cross section taken along line C-C'.

In this embodiment, VNW FETs constituting the memory cells have a horizontally long shape. It is however acceptable to place two circular VNW FETs side by side horizontally instead of one horizontally long VNW FET.

Details of the layout structure of the memory cell array 1 in this embodiment will be described hereinafter.

In the memory cell array 1, transistors T51 to T54, T61 to T64, T71 to T74, and T81 to T84, each constituting a one-bit memory cell, are n-conductivity type VNW FETs each having one horizontally long VNW. The transistors T51 to T54 are arranged in the X direction, the transistors T61 to T64 are arranged in the X direction, the transistors T71 to T74 are arranged in the X direction, and the transistors T81 to T84 are arranged in the X direction. These transistors T51 to T54, T61 to T64, T71 to T74, and T81 to T84 are arranged in four columns in the Y direction.

A region ADT for formation of dummy memory cells is placed around the transistors T51 to T54, T61 to T64, T71 to T74, and T81 to T84 constituting memory cells. Specifically, dummy memory cells are placed between the memory cell array 1 and word line straps 2 on both sides of the memory cell array 1 in the X direction. Also, dummy memory cells are placed between the memory cell array 1 and bit line straps 3 on both sides of the memory cell array 1 in the Y direction. Dummy transistors, e.g., dummy transistors DT3 and DT4, constituting the dummy memory cells are placed in the region ADT.

Bottom interconnects 111, 112, 113, and 114 are formed to extend in the Y direction throughout the memory cell array 1. The bottom interconnects 111, 112, 113, and 114 are bit lines BL. Bottom interconnects 115 and 116 are also placed to extend in the Y direction on both sides of the group of the bottom interconnects 111, 112, 113, and 114 in the X direction. The bottom interconnects 115 and 116 (corresponding to the third ground potential line) supply the power supply voltage VSS. The bottom interconnects 111, 112, 113, 114, 115, and 116 each have an interconnect width corresponding to two grid cells.

The transistors T51, T61, T71, and T81 lining up in the Y direction overlap the bottom interconnect 111 as viewed from top, and the bottoms thereof are connected with the bottom interconnect 111. The transistors T52, T62, T72, and T82 lining up in the Y direction overlap the bottom interconnect 112 as viewed from top, and the bottoms thereof are connected with the bottom interconnect 112. The transistors T53, T63, T73, and T83 lining up in the Y direction overlap the bottom interconnect 113 as viewed from top, and the bottoms thereof are connected with the bottom interconnect 113. The transistors T54, T64, T74, and T84 lining up in the Y direction overlap the bottom interconnect 114 as viewed from top, and the bottoms thereof are connected with the bottom interconnect 114.

Dummy transistors overlapping the bottom interconnects 115 and 116 as viewed from top, e.g., the dummy transistor DT4, are connected with the bottom interconnects 115 and 116 at their bottoms.

Gate interconnects 121, 122, 123, and 124 are formed to extend in the X direction throughout the memory cell array 1. The gate interconnects 121, 122, 123, and 124 are word lines WL. Gate interconnects 125 and 126 are also placed to extend in the X direction on both sides of the group of the gate interconnects 121, 122, 123, and 124 in the Y direction. The gate interconnects 125 and 126 (corresponding to the second ground potential line) supply the power supply voltage VSS.

The gates of the transistors T51, T52, T53, and T54 lining up in the X direction are connected with the gate interconnect 121. The gates of the transistors T61, T62, T63, and T64 lining up in the X direction are connected with the gate interconnect 122. The gates of the transistors T71, T72, T73, and T74 lining up in the X direction are connected with the gate interconnect 123. The gates of the transistors T81, T82, T83, and T84 lining up in the X direction are connected with the gate interconnect 124.

Dummy transistors overlapping the gate interconnects 125 and 126 as viewed from top, e.g., the dummy transistor DT3, are connected with the gate interconnects 125 and 126 at their gates.

The tops of the transistors T51 to T54, T61 to T64, T71 to T74, and T81 to T84 are respectively connected to local interconnects 351 to 354, 361 to 364, 371 to 374, and 381 to 384 formed in a layer above the transistors.

M1 interconnects 141, 142, 143, and 144 extending in the Y direction are formed in a layer above the transistors T51 to T54, T61 to T64, T71 to T74, and T81 to T84. Bit data "0" or "1" of each of the memory cells is set depending on whether or not connection is established between the M1 interconnects 141, 142, 143, and 144 (corresponding to the ground potential line) and the local interconnects 351 to 354, 361 to 364, 371 to 374, and 381 to 384. In FIG. 13, vias are formed between the M1 interconnect 141 and the local interconnect 371, between the M1 interconnect 142 and the local interconnect 362, between the M1 interconnect 143 and the local interconnect 383, and between the M1 interconnect 144 and the local interconnects 354 and 374. That is, the transistors T71, T62, T83, T54, and T74 are in the "connected" state, and the other transistors are in the "non-connected" state.

In the M1 interconnect layer, M1 interconnects 161, 162, 163, and 164 extending in the Y direction are respectively formed on the right sides of the M1 interconnects 141, 142, 143, and 144 as viewed from the figure. The M1 interconnects 161, 162, 163, and 164 (corresponding to the second bit line) respectively overlap the bottom interconnects 111, 112, 113, and 114 as viewed from top. The M1 interconnects 161, 162, 163, and 164 are respectively connected with the bottom interconnects 111, 112, 113, and 114 through local interconnects and vias in the bit line straps 3.

M2 interconnects 151, 152, 153, and 154 extending in the X direction are formed in a layer above the transistors T51 to T54, T61 to T64, T71 to T74, and T81 to T84. The M2 interconnects 151, 152, 153, and 154 (corresponding to the second word line) are respectively connected with the gate interconnects 121, 122, 123, and 124 that are word lines WL through local interconnects, M1 interconnects, and vias in the word line straps 2.

M2 interconnects 155 and 156 are formed on both sides of the group of the M2 interconnects 151, 152, 153, and 154 in the Y direction. The M2 interconnects 155 and 156 supply the power supply voltage VSS. Both the M2 interconnects 155 and 156 are connected with the M1 interconnects 141, 142, 143, and 144 through vias.

In this embodiment, in the memory cell array 1, the memory cells include the transistors T51 to T54, T61 to T64, T71 to T74, and T81 to T84 that are VNW FETs. The gates of the transistors T51 to T54, T61 to T64, T71 to T74, and T81 to T84 are connected with the gate interconnects 121 to 124 (word lines WL), the bottoms thereof are connected with the bottom interconnects 111 to 114 (bit lines BL), and the tops thereof are selectively connected with the M1 interconnects 141 to 144 (ground potential lines). That is, the bottom electrodes of the transistors T51 to T54, T61 to T64, T71 to T74, and T81 to T84 are connected to the bottom interconnects 111 to 114 irrespective of the data stored in the memory cells. This prevents or reduces variations in load capacitance among the bit lines BL and, as a result, can prevent or reduce variations in operations such as a delay.

Dummy memory cells are placed around the memory cell array 1. This prevents or reduces variations in the fabrication of memory cells, and thus leads to improvement in the reliability of the semiconductor integrated circuit device and also improvement in yield.

The bottom interconnects extend in the Y direction, and have the same interconnect width and a fixed interconnect pitch. The gate interconnects extend in the X direction, and have the same interconnect width and a fixed interconnect pitch. The M1 interconnects extend in the Y direction, and have the same interconnect width and a fixed interconnect pitch. The M2 interconnects extend in the X direction, and have the same interconnect width and a fixed interconnect pitch.

Therefore, the fabrication precision of the semiconductor integrated circuit device improves, and variations in device characteristics are prevented or reduced. Note that all the interconnects in each layer are not necessarily required to be the same in direction, interconnect width, or interconnect pitch.

Other Embodiments (No. 1)

While dummy memory cells are placed around the memory cell array 1 in the layout structure examples described above, it is not necessarily required to place dummy memory cells. Otherwise, dummy memory cells may be placed partly around the memory cell array 1.

(No. 2)

While the VNWs have a circular or horizontally long planar shape in the layout structure examples described above, the planar shape of the VNWs is not limited to these. For example, the VNWs can have an oval planar shape. Also, all VNWs do not need to have the same shape, but VNWs having different planar shapes may be present in a mixed manner. For example, circular VNWs and oval VNWs may be present in a mixed manner.

While one transistor is constituted by one VNW in the embodiments described above, one transistor may be constituted by a plurality of VNWs.

According to the present disclosure, it is possible to implement a layout of a ROM using VNW FETs that can prevent or reduce variations in operations. The present disclosure is therefore useful for improving the performance of semiconductor chips, for example.

What is claimed is:

1. A semiconductor integrated circuit device provided with a memory cell array comprising a plurality of read only memory (ROM) cells, comprising:
    first and second word lines extending in a first direction;
    first and second bit lines extending in a second direction perpendicular to the first direction; and
    first and second ground potential lines each of which is a metal interconnect extending in the second direction in a layer above the first and second bit lines, the first ground potential line overlapping the first bit line as viewed from top, and the second ground potential line overlapping the second bit line as viewed from top,
    wherein the plurality of ROM cells include:
        a first ROM cell comprising a first transistor that is a vertical nanowire (VNW) field effect transistor (FET) provided between the first bit line and the first ground potential line with its gate connected to the first word line,
        a second ROM cell comprising a second transistor that is a VNWFET provided between the second bit line and the second ground potential line with its gate connected to the first word line,
        a third ROM cell comprising a third transistor that is a VNWFET provided between the first bit line and the first ground potential line with its gate connected to the second word line, and
        a fourth ROM cell comprising a fourth transistor that is a VNWFET provided between the second bit line and the second ground potential line with its gate connected to the second word line,
    each of the first and second word lines is a gate interconnect,
    each of the first and second bit lines is a bottom interconnect,
    the gate electrode of the first transistor is connected with the first word line, a bottom electrode of the first transistor is connected with the first bit line, and a top electrode of the first transistor is selectively connected with the first ground potential line,
    the gate electrode of the second transistor is connected with the first word line, a bottom electrode of the second transistor is connected with the second bit line, and a top electrode of the second transistor is selectively connected with the second ground potential line,
    the gate electrode of the third transistor is connected with the second word line, a bottom electrode of the third transistor is connected with the first bit line, and a top electrode of the third transistor is selectively connected with the first ground potential line,
    the gate electrode of the fourth transistor is connected with the second word line, a bottom electrode of the fourth transistor is connected with the second bit line, and a top electrode of the fourth transistor is selectively connected with the second ground potential line, and
    each of the ROM cells stores data depending on whether or not connection is established between the top electrode of each of the first through fourth transistors and the first or second ground potential line.

2. The semiconductor integrated circuit device of claim 1, further comprising:
    a third ground potential line extending in the first direction: and
    a dummy memory cell,
    wherein the dummy memory cell includes a dummy transistor that is a VNW FET provided between the first bit line and the first ground potential line with its gate connected to the third ground potential line.

3. The semiconductor integrated circuit device of claim 1, further comprising:
   a third ground potential line that is a bottom interconnect extending in the second direction: and
   a dummy memory cell,
   wherein the dummy memory cell includes a dummy transistor that is a VNW FET provided between the third ground potential line and the first ground potential line with its gate connected to the first word line.

4. The semiconductor integrated circuit device of claim 1, further comprising:
   a third word line that is a metal interconnect extending in the first direction in a layer above the first word line to overlap the first word line as viewed from top,
   wherein the first word line and the third word line are connected together.

5. The semiconductor integrated circuit device of claim 1, further comprising:
   a third bit line that is a metal interconnect extending in the second direction in a layer above the first bit line to overlap the first bit line as viewed from top,
   wherein the first bit line and the third bit line are connected together.

6. The semiconductor integrated circuit device of claim 5, wherein the third bit line is placed in a same interconnect layer as the first ground potential line.

* * * * *